(12) United States Patent
Kuo et al.

(10) Patent No.: US 7,759,721 B2
(45) Date of Patent: Jul. 20, 2010

(54) SINGLE POLY NON-VOLATILE MEMORY DEVICE WITH INVERSION DIFFUSION REGIONS AND METHODS FOR OPERATING THE SAME

(75) Inventors: Ming-Chang Kuo, Changhua (TW); Chao-I Wu, Tainan (TW)

(73) Assignee: Macronix International Co., Ltd. (TW)

( * ) Notice: Subject to any disclaimer, the term of this patent is extended or adjusted under 35 U.S.C. 154(b) by 84 days.

(21) Appl. No.: 11/383,924

(22) Filed: May 17, 2006

(65) Prior Publication Data
US 2007/0267677 A1 Nov. 22, 2007

(51) Int. Cl.
*H01L 29/788* (2006.01)
(52) U.S. Cl. ............... 257/315; 257/270; 257/316; 257/319; 257/320; 257/E29.129; 257/E29.305; 257/E29.306; 257/E21.68
(58) Field of Classification Search .......... 257/270, 257/314–326, E29.129, E29.305, E29.306, 257/E29.309, E21.68, E21.681, E21.69, E21.422, 257/E29.136
See application file for complete search history.

(56) References Cited

U.S. PATENT DOCUMENTS

| 5,338,952 | A  * | 8/1994  | Yamauchi ........... 365/185.15 |
| 2001/0010646 | A1 * | 8/2001  | Saeki et al. ......... 365/185.22 |
| 2005/0145923 | A1 * | 7/2005  | Chen et al. ............... 257/315 |
| 2006/0043465 | A1 | 3/2006 | Terauchi |
| 2006/0158932 | A1 * | 7/2006 | Tamada et al. ......... 365/185.2 |
| 2006/0273378 | A1 * | 12/2006 | Gao et al. .................. 257/326 |

FOREIGN PATENT DOCUMENTS

CN 1512565 7/2004

OTHER PUBLICATIONS

Kung-Hong Lee, et al., "New Single-poly EEPROM with Cell Size Down to 8F2 for High Density Embedded Nonvolatile Memory Applications", 2003 Symposium on VLSI Technology Digest of Technical Papers.
Virgil Niles Kynett, et al., "An In-System Reprogammable 256K CMOS Flash Memory", Feb. 18, 1988.
Y. Sasago, et al., 90-nm-node Multi-Level AG-AND Type Flash Memory with Cell Size of True 2 F2/bit and Programming Throughout of 10 MB/s, 2003 IEEE.

* cited by examiner

*Primary Examiner*—Sue Purvis
*Assistant Examiner*—Leslie Pilar Cruz
(74) *Attorney, Agent, or Firm*—Baker & McKenzie LLP

(57) ABSTRACT

A non-volatile memory device comprises a substrate with the dielectric layer formed thereon. A control gate and a floating gate are then formed on top of the dielectric layer. Accordingly, a non-volatile memory device can be constructed using a single poly process that is compatible with conventional CMOS processes. In addition, an assist gate, or assist gates are formed on the dielectric layer next to and between the control gate and floating gate respectively. The assist gates are used to form inversion diffusion regions in the substrate. By using the assist gates to form inversion diffusion regions, the overall size of the device can be reduced, which can improve device density.

9 Claims, 16 Drawing Sheets

SINGLE POLY NON-VOLATILE MEMORY DEVICE WITH INVERSION DIFFUSION REGIONS AND METHODS FOR OPERATING THE SAME

BACKGROUND

1. Field of the Invention

The embodiments described herein are directed to non-volatile memory devices, and more particularly to a non-volatile memory device comprising a single polysilicon gate layer that is compatible with CMOS processing techniques.

2. Background of the Invention

Many non-volatile semiconductor memories are based on the well known MOS-type structure. In other words, they comprise a gate structure separated from a substrate by a dielectric layer. Diffusion regions are implanted in the substrate under the corners of the gate structure. When the appropriate voltages are applied to the diffusion regions and the control gate, a channel can be created in the upper layers of the substrate between the diffusion regions and under the gate structure. Carriers, e.g., electrons, can travel the channel between the diffusion regions.

If a sufficient field component is present in the direction of the gate structure, the carriers, e.g., electrons, can be attracted to the gate structure. If the electrons have enough energy to overcome the barrier height of the dielectric layer, then these carriers can be injected through the dielectric layer.

For example, FIG. 1 is a diagram illustrating a conventional floating gate memory device 100. It will be understood that such a floating gate device can be the basic memory structure of a conventional flash memory device. Floating gate device 100 comprises of substrate 102 into which diffusion region 104 and 106 have been implanted. In the example of FIG. 1, device 100 is an NMOS device, meaning that substrate 102 is a P-type substrate while diffusion regions 104 and 106 are N+-type diffusion regions. It will be understood that certain memory devices can also make use of PMOS structures in which substrate 102 is an N-type substrate and diffusion regions 104 and 106 are P+-type diffusion regions.

A dielectric layer 110 is then formed over the substrate between diffusion regions 104 and 106. This dielectric layer is often a silicon dioxide dielectric layer and can be referred to as the tunnel oxide layer. A floating gate 112 is formed on top of dielectric layer 110. Floating gate 112 is typically formed from a polysilicon layer that is deposited on top of substrate 102 and etched to the appropriate dimensions. An inter-dielectric layer 114 is then formed over floating gate 112, and a control gate 116 is then formed on inter-dielectric layer 114. As with floating gate 112, control gate 116 is typically formed from a polysilicon layer that is etched to the appropriate dimensions.

When the appropriate voltages are applied to control gate 116 and diffusion regions 104 and 106, a channel can be formed in channel region 108 of substrate 102. The voltage applied to control gate 116 will couple with floating gate 112 to create the field component necessary to attract carriers in channel region 108 to floating gate 112. It will be understood, that the coupling between control gate 116 and floating gate 112 is dependent on the voltage applied to control gate 116 as well as the dimensions associated with control gate 116, inter-dielectric layer 114, and floating gate 112.

It will further be understood that density and cost are important driving factors in non-volatile semiconductor memory technology. The ever-expanding uses for non-volatile semiconductor memories require such memories to be mass-producible at low cost. Further, the requirements of new applications for non-volatile semiconductor memories require increased capacity, and a decreased footprint.

Device 100 of FIG. 1 presents several problems in this regard. First, because both floating gate 112 and control gate 116 are formed from polysilicon layers, device 100 is fabricated using what is termed a double poly process. This makes fabrication of device 100 incompatible with conventional CMOS techniques, which are single poly processes. As a result, special processes are required in order to fabricate device 100. Second, the need for diffusion regions 104 and 106, and for sufficient coupling between control gate 116 and floating gate 112, limits the minimum dimensions that can be achieved for device 100. For example, a certain active area is required in order to provide proper operation.

FIG. 2 is a diagram illustrating a conventional floating gate device 200 that overcomes some of the limitations associated with device 100 of FIG. 1. As can be seen, device 200 comprises a substrate 102 and diffusion regions 104, 106, and 116 implanted therein. Floating gate 112 is then formed over dielectric layer 110, which is formed over the substrate 102. In device 200, however, control gate 114 is also formed on dielectric 110 separated from floating gate 112 as illustrated. Voltages applied to control gate 114 can still couple with floating gate 112 to thereby induce carriers in channel region 108 to tunnel through dielectric layer 110 onto floating gate 112.

Advantageously, floating gate 112 and control gate 114 can be formed using a single poly process, which can make fabrication of device 200 compatible with conventional CMOS techniques; however, device 200 does not overcome the minimum dimension restrictions associated with device 100.

SUMMARY

A non-volatile memory device comprises a substrate with the dielectric layer formed thereon. A control gate and a floating gate are then formed on top of the dielectric layer. Accordingly, a non-volatile memory device can be constructed using a single poly process that is compatible with conventional CMOS processes. In addition, assist gates are formed on the dielectric layer next to and between the control gate and floating gate respectively.

In one aspect the assist gates are used to form inversion diffusion regions in the substrate. By using the assist gates to form inversion diffusion regions, the overall size of the device can be reduced, which can improve device density.

In another aspect, one or more of the assist gates can be used for enhanced coupling with the floating gate to turn on a channel below the floating gate. By using the assist gates to enhance coupling with the floating gate, lower voltages can be used and smaller active areas are required.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

The embodiments described below are directed to a non-volatile memory device comprising a substrate with a dielectric layer formed thereon. A floating gate is then formed on the dielectric layer over the substrate and a control gate is then disposed next to the floating gate on the dielectric layer. In addition, an assist gate, or assist gates are formed on the dielectric layer next to and between the control gate and floating gate, respectively. The assist gate(s) can be used to form inversion diffusion regions in the substrate that can then produce a channel region to support carriers that can be used to program the device. The assist gate(s) can then also be used to enhance coupling to the floating gate. Voltages applied to the assist gate(s) can couple with the floating gate and provide the field necessary to cause some of the carriers in the channel region to penetrate the dielectric layer into the floating gate.

It will be understood that any dimensions, measurements, ranges, test results, numerical data, etc., are approximate in nature and unless otherwise stated not intended as precise data. The nature of the approximation involved will depend on the nature of the data, the context and the specific embodiments or implementations being discussed.

Figure 1:
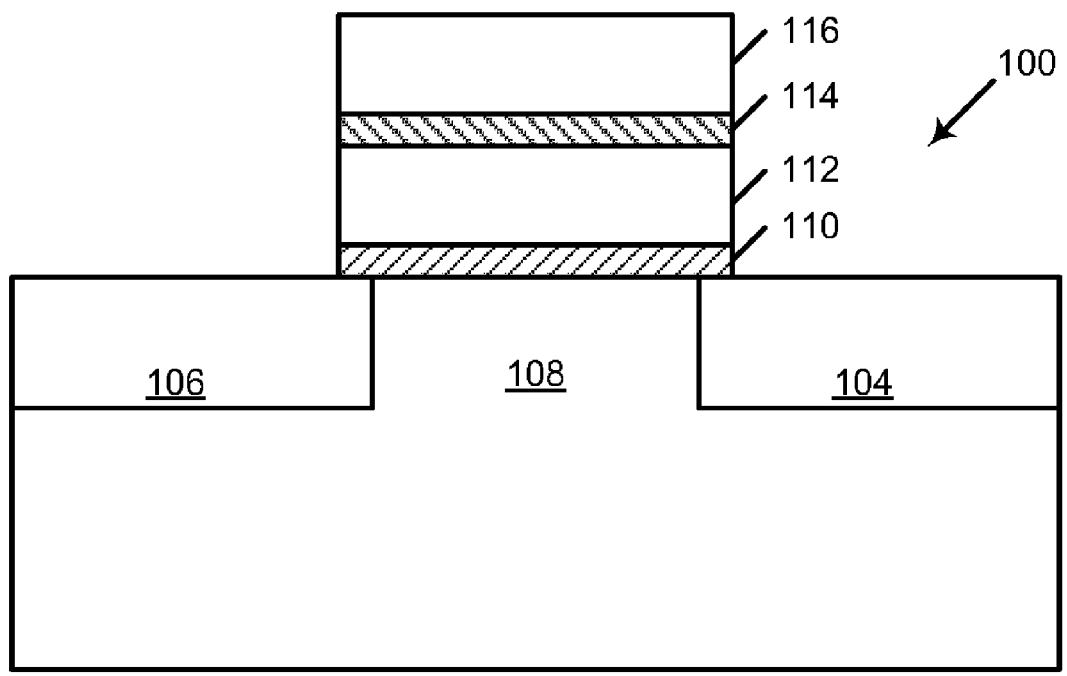
FIG. 1 is a diagram illustrating a conventional floating gate memory device.
Figure 2:
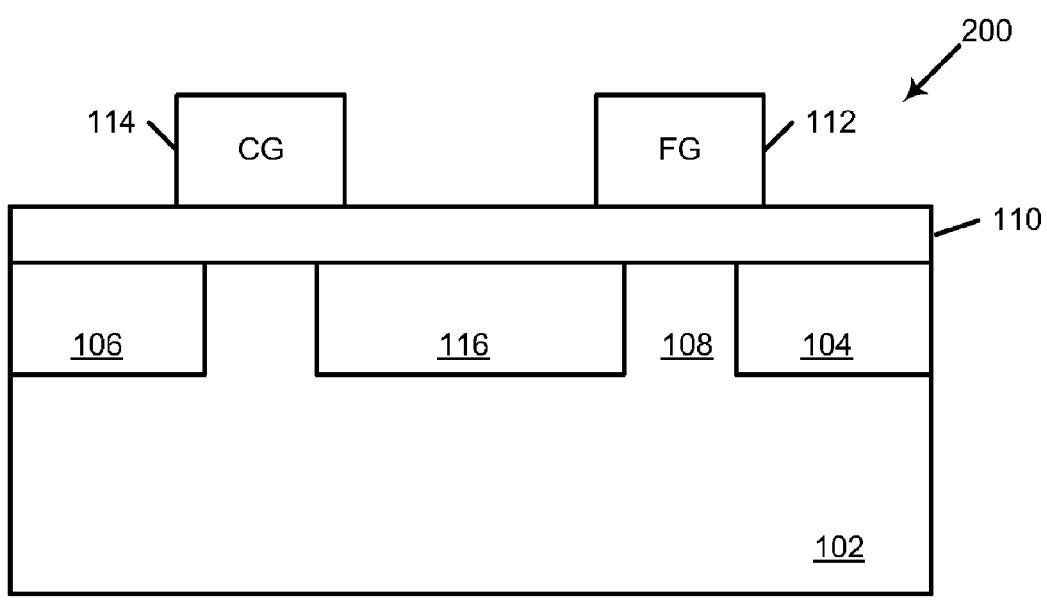
FIG. 2 is a diagram illustrating a conventional floating gate memory device that is compatible with the single poly fabrication process.
Figure 3:
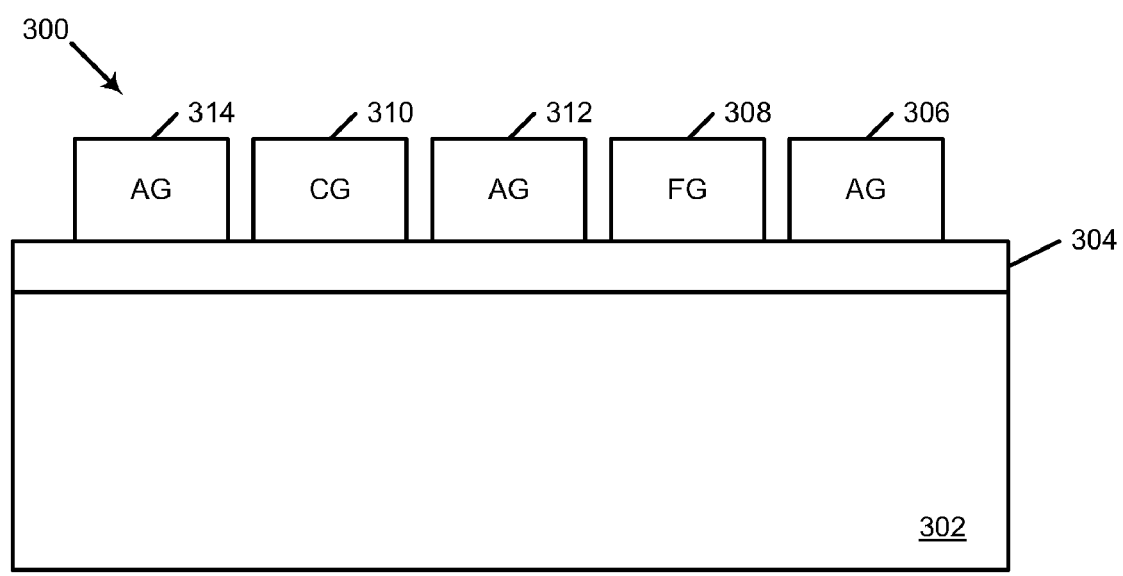
FIG. 3 is a diagram illustrating a non-volatile memory device configured in accordance with one embodiment.

FIG. 3 is a diagram illustrating an example non-volatile memory device 300 configured in accordance with one embodiment. Device 300 is an NMOS device. Thus, device 300 comprises a P-type substrate 302. It will be understood, however, that in other embodiments device 300 can be a PMOS device comprising an N-type substrate. Accordingly, the examples described herein should not be seen as limiting the methods and devices described herein to NMOS devices. P-type substrate 302 can have a dielectric layer 304 formed thereon. For example, dielectric layer 304 can be a silicon dioxide, dielectric layer. Assist gates 306, 312, and 314 are then formed on the dielectric layer along with floating gate 308 and a control gate 310. Importantly, assist gates 306, 312, and 314 as well as floating gates 308 and control gate 310, can be formed using a single poly fabrication process.

By applying the proper voltages to assist gates 306, 312 and 314, inversion diffusion regions can be formed under dielectric layer 304 in substrate 302. In the example of FIG. 3, the inversion diffusion regions are N+ diffusion regions.

Figure 4:
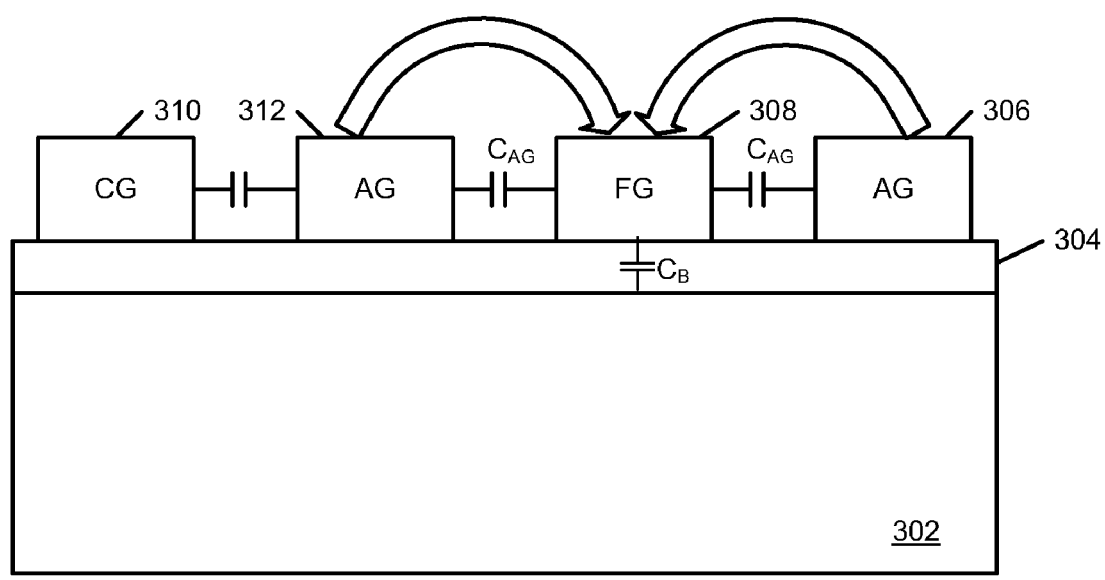
FIG. 4 is a diagram illustrating the coupling between assist gates and a floating gate for the device of FIG. 3.

Assist gates 306 and 312 can couple with floating gate 308 in order to provide the field necessary to induce carriers in substrate 302 to penetrate dielectric layer 304 into floating gate 308. This coupling can be illustrated with the aid of FIGS. 4 and 5. FIG. 4 is a diagram illustrating the capacitance formed between the various gates and layers of device 300. As can be seen, when voltages are applied to assist gates 306 and 312 these voltages can be coupled to floating gate 308 via assist gate capacitances ($C_{AG}$). Floating gate 308 is then coupled with substrate 302 via bulk capacitance ($C_B$). It is the capacitive coupling mechanisms that create the field necessary to cause carriers in substrate 302 to penetrate dielectric layer 304 into floating gate 308.

Figure 5:
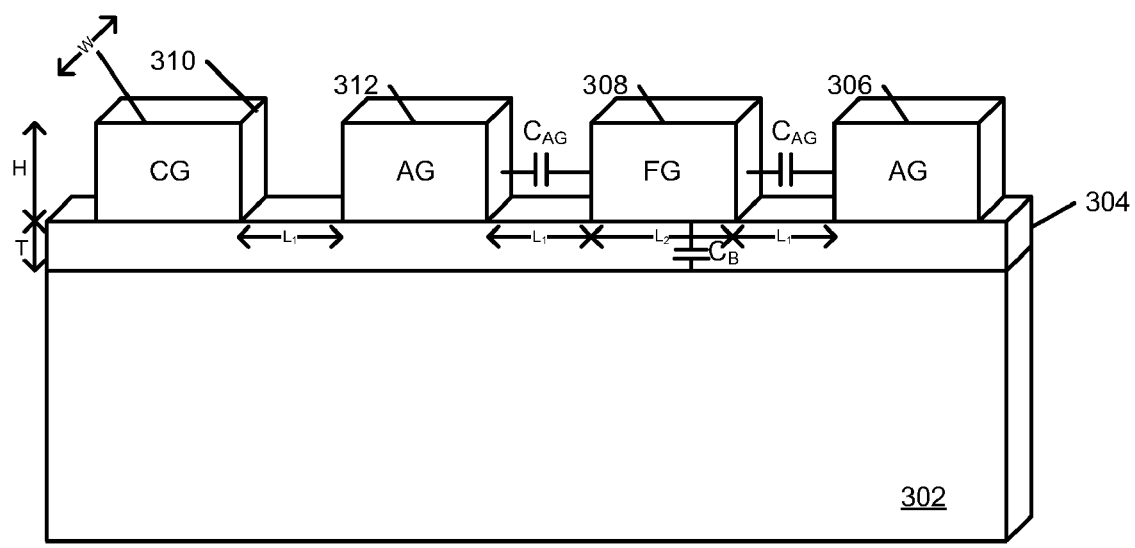
FIG. 5 is a diagram illustrating the dimensions associated with the gates and layers of the device in FIG. 3.

FIG. 5 is a diagram illustrating example dimensions associated with device 300 in accordance with one particular implementation. These dimensions can be used to illustrate the coupling that can be produced for device 300. First, the assist gate capacitance ($C_{AG}$), and bulk capacitance ($C_B$) are given by the following equations:

$$C_{AG} = \in(H*W)/L1 \quad (1)$$

$$C_B = \in(L2*W)/T \quad (2)$$

Where,
  $\in$ = dielectric constant; and
  W = the width of the gate into the page.
  H = the height of the gate
  L1 = the spacer length between the gates.
  L2 = the length of floating gate
  T = the thickness of dielectric layer Thus, the assist gate capacitance ($C_{AG}$) is equal to $\in$ multiplied by the height of assist gates 306 and 312, multiplied by the width of assist gates 306 and 312, and then divided by the spacing between assist gates 306 and 312 and floating gate 308. The bulk capacitance ($C_B$) is equal to $\in$ multiplied by the length of floating gate 308, multiplied by the width of floating gate 308, and then divided by the height of dielectric layer 304. In the example of FIGS. 3-5, assist gates 306 and 312 comprise the same dimensions and spacing so that ($C_{AG}$) for each assist gate is the same. In other embodiments, however, the dimensions for the assist gates can vary, providing different assist gate capacitances.

The total capacitance is then given by the following equation:

$$C_{TOT} = C_{AG} + C_{AG} + C_B \quad (3)$$

The coupling ratio between assist gates 306 and 312 and floating gate 308 is then given by the following equation;

$$\alpha_{AG} = C_{AG}/C_{TOT} \quad (4)$$

Accordingly, the voltage on floating gate 308 can be given by the following equation;

$$V_{FG} = (2*V_{AG}*\alpha_{AG}) \quad (5)$$

Where,
  $V_{AG}$ = the assist gate voltage.

For example, in one embodiment a non-volatile memory device configured in accordance with the systems and methods described herein can comprise the following dimensions;

H=1000 Å;
L1=200 Å;
L2=600 Å; and
T=100 Å.

Thus, the total capacitance is then given by equation (3):

$$C_{TOT} = C_{AG} + C_{AG} + C_B = \in 16W$$

The coupling between assist gate 306 and floating gate 308 is then given by equation (4);

$$\alpha_{AG} = C_{AG}/C_{TOT} = \in 5W/\in 16W = 5/16$$

The voltage on floating gate 308 can be given by equation (5):

$$\begin{aligned}V_{FG} &= 2 * V_{AG} * \alpha_{AG}\\ &= 2V_{AG} * 5/16\\ &= V_{AG} * 5/8\end{aligned}$$

It will be understood that the dimensions described above can vary depending on the requirements of a specific invention; however, it will be clear that sufficient coupling must be achieved regardless of the dimensions used. Accordingly, the actual dimension for a given implementation must be sufficient to provide the required coupling.

In certain other embodiments, for example, the dimensions described above can have values in the following approximate ranges:

H=800-1500 Å;
L1=160-300 Å;
L2=400-800 Å; and
T=50-250 Å.

Further, it will be understood that while the spacing between the gates was uniform in the examples described above, other embodiments can have non-uniform spacing.

Using assist gates 306 and 312 to form inversion diffusion region can lead to lower active areas and lower overall device dimensions. This can further improve densities and lower cost. Further, as mentioned, device 300 does not include diffusion regions, which can further reduce device size and increase densities.

Figure 6:
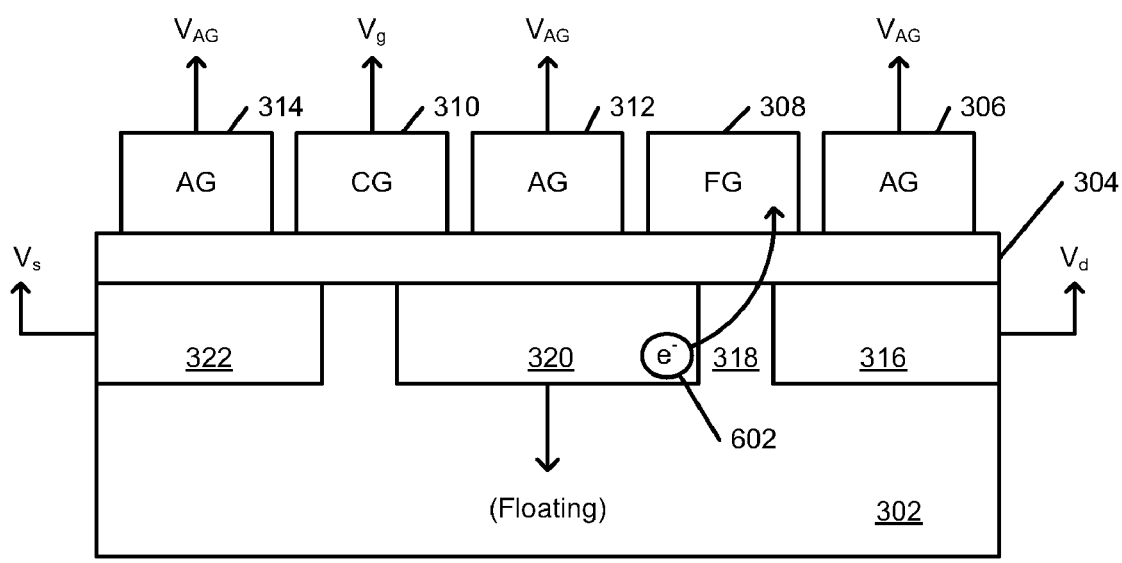
FIG. 6 is a diagram illustrating an example of program operation for the device of 3 in accordance with one embodiment.

Inversion diffusion regions can be formed in device 300 in order to produce the carriers necessary to program and erase floating gate 308. This can be illustrated with the aid of FIGS. 6-8. FIG. 6 is a diagram illustrating an example program operation for device 300 in accordance with one embodiment. By applying the proper voltages to assist gates 306, 312, and 314, N+ diffusion regions 316, 320, and 322 can be formed in substrate 302. Voltages can then be applied to these diffusion regions in order to create a large lateral electric field between diffusion regions 316 and 320. The voltage coupled with floating gate 308 can produce a channel in channel region 318 and the large lateral electric field can induce carrier 602, i.e., hot electrons, to flow in the channel from diffusion region 320 toward diffusion region 316 and inject through dielectric layer 304 into floating gate 308. Accordingly, in the example of FIG. 6, Channel Hot Electron (CHE) programming is used to vary the threshold of floating gate 308.

Device 300 can be thought of as comprising two parts, a storage cell comprising floating gate 308 and inversion diffusion regions 316 and 320, and an access transistor comprising control gate 310 and inversion diffusion regions 320 and 322. These two parts are in series so that the access transistor must be turned on in order for current to flow in the storage cell. Thus, when sufficient voltage is applied to assist gates 306, 312, and 314, inversion diffusion regions 316, 320, and 322 will be formed in substrate 302. When a voltage sufficient to turn on the access transistor is applied to control gate 310, then current can flow in the storage cell. When a sufficiently large programming voltage is coupled with floating gate 308, then the storage cell can be programmed, i.e., charge can be stored on floating gate 308.

It will be understood, that carrier 602 must have sufficient energy to overcome the barrier height of dielectric layer 304. For example, if dielectric layer 304 is a silicon dioxide dielectric layer, then carrier 602 must have energies exceeding 3.2 eV in order to overcome the barrier height of the silicon dioxide layer 304.

Thus, high voltages must be applied to assist gates 306 and 312 in order to couple voltage to floating gate 308. The voltage of control gate 310 and floating gate 308 can produce a channel in channel region 318. In the example of FIG. 6, a high voltage (Vg) of approximately 1V is applied to control gate 310, while high voltage ($V_{AG}$) of approximately 8V is applied to assist gates 306, 312, and 314. Further, a high voltage (Vd) of approximately 5V is applied to diffusion region 316, while diffusion region 322 is tied to a voltage (Vs) of approximately 0V. Inversion diffusion region 320 is left floating.

It will be understood that the voltages illustrated are by way of example only and that the actual voltages will depend on the requirements of the specific implementation. For example, in certain embodiments, the voltage applied to control gate 310 can be in the approximate range of 0.5-1.5 V, The voltage applied to assist gates 306, 312, and 314 can be in the approximate range of 6-9V, and the voltage applied to diffusion region 316 can be in the approximate range of 4-6V.

The voltage applied to diffusion region 316 is provided in order to produce the large lateral electric field necessary to induce carrier 602 to flow in channel region 318 and provide carrier 602 with enough energy to inject into layer 304.

Figure 7:
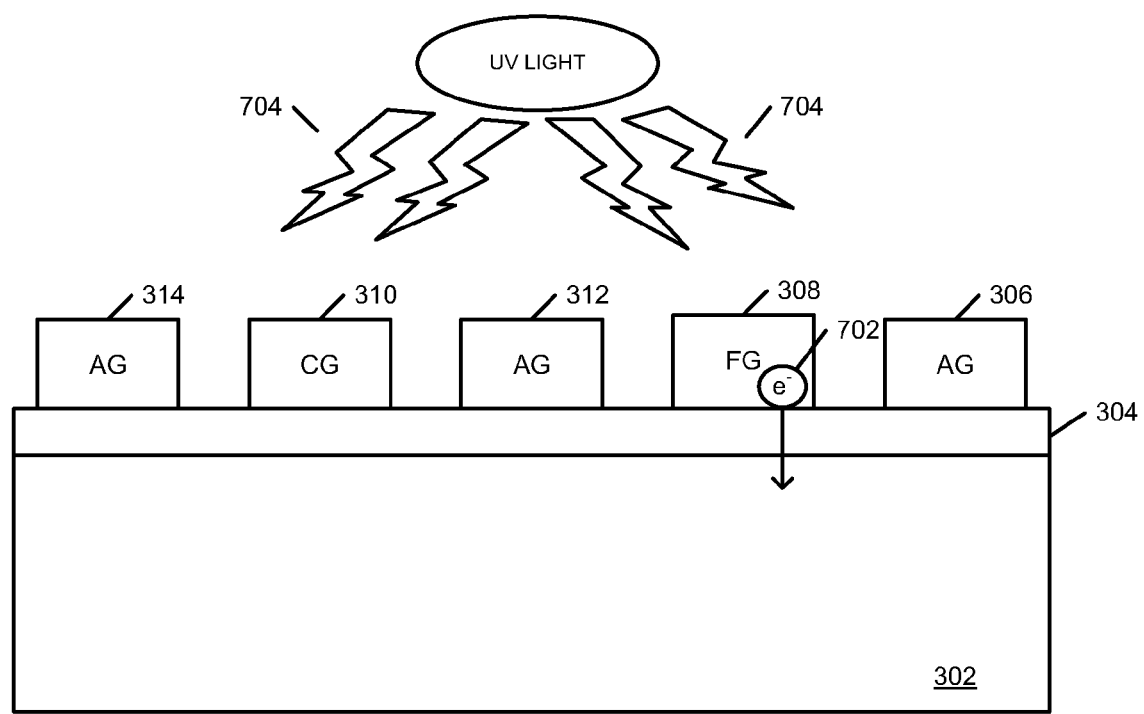
FIG. 7 is a diagram illustrating an example of an erase operation for the device of FIG. 3 in accordance with one embodiment.

FIG. 7 is a diagram illustrating an example erase operation for device 300 in accordance with one embodiment. In the example of FIG. 7, ultraviolet (UV) radiation 704 is incident on device 300. The energy from radiation 704 will provide electron 702 with sufficient energy to penetrate dielectric layer 304 and escape back into substrate 302.

Figure 8:
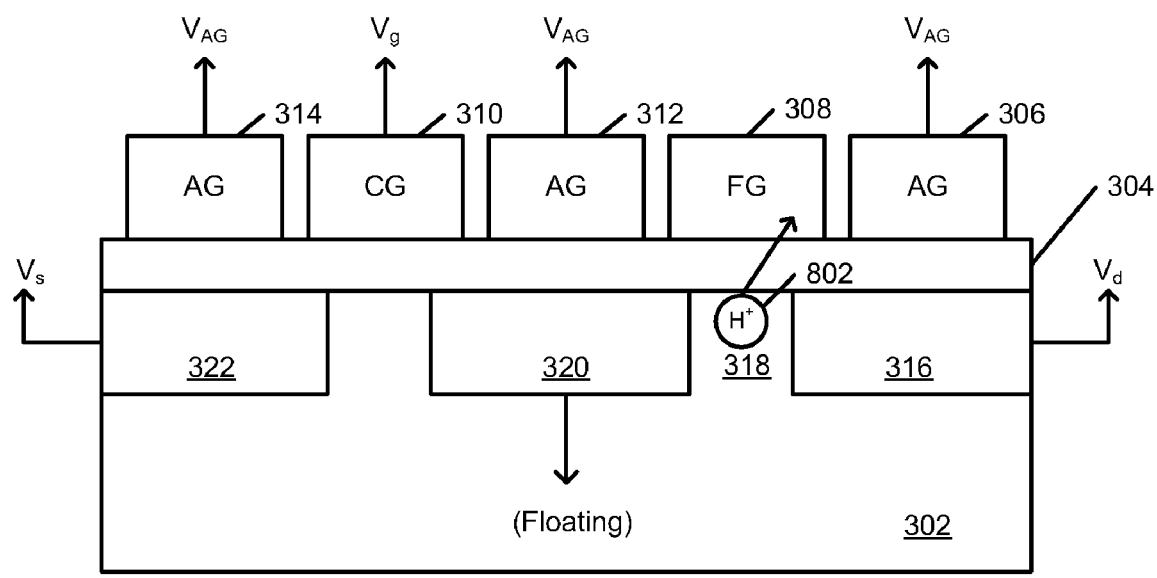
FIG. 8 is a diagram illustrating an example of an erase operation for the device of FIG. 3 in accordance with another embodiment.

In FIG. 8, avalanche hot carrier injection is used to erase device 300 in accordance with another embodiment. Thus, in the example of FIG. 8, voltages are applied to diffusion region 320 and 316 in order to create a large lateral electric field that will cause carriers 802, in this case holes 802, to travel in channel 318 and inject into floating gate 308, where they will compensate for electrons stored on floating gate 308. Further, high voltages must be applied to assist gates 306, 312, and 314 in order to create inversion diffusion regions 316, 320, and 322.

In the example in FIG. 8, a high voltage (Vd) in the approximate range of 4-6V, e.g., approximately 5V, is applied to inversion diffusion region 316, while a low voltage (Vs) of approximately 0V is applied to inversion diffusion region 322. These voltages produce the high lateral electric field needed to induce holes 802 into channel region 318. High voltages ($V_{AG}$) in the approximate range of 2-5V, e.g., approximately 3V, are applied to assist gates 306, 312, and 314 in order to create inversion diffusion regions 316, 320, and 322. A high voltage (Vg) in the approximate range of 3-5V, e.g., approximately 4V, is applied to control gate 310. Inversion diffusion region 320 is again allowed to float.

It will be understood, however, that the voltages illustrated in FIG. 8 are by way of example only and that the actual voltages used will depend on the requirements of a specific implementation.

Figure 9:
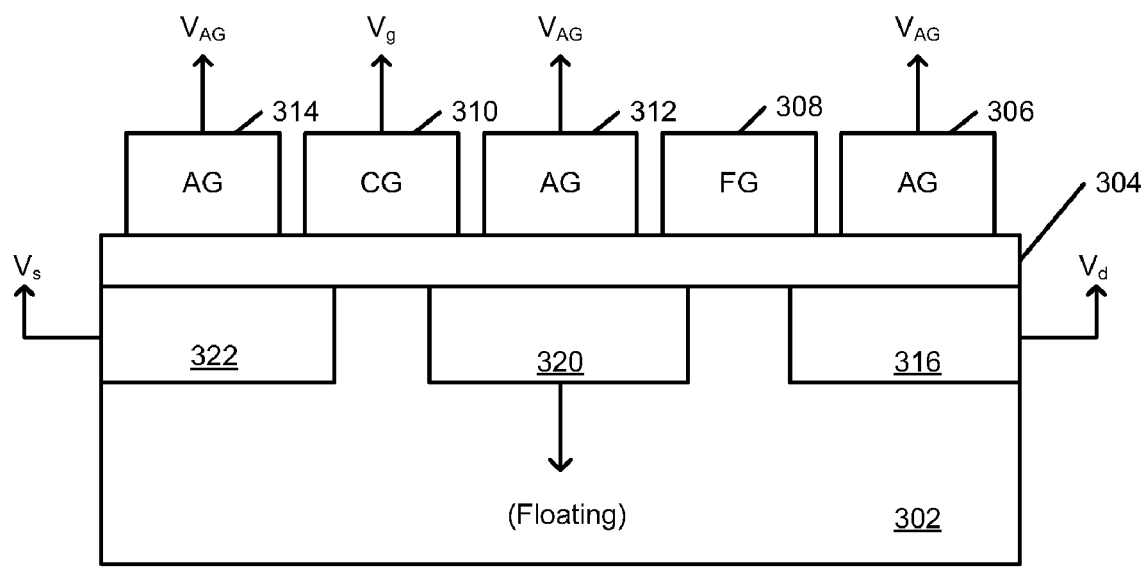
FIG. 9 is a diagram illustrating an example of read operation for the device of FIG. 3 in accordance with one embodiment.

FIG. 9 is a diagram illustrating an example read operation for device 300 in accordance with one embodiment. First, high voltages must be applied to assist gates 306, 312, and 314 in order to create inversion diffusion regions 316, 320, and 322. A high voltage can then be applied to control gate 310. A high voltage can also be applied to inversion diffusion region 322, while a low voltage is applied to inversion diffusion region 316.

In the example of FIG. 9, high voltages ($V_{AG}$) in the approximate range of 6-9V, e.g., approximately 8V, are applied to assist gates 306, 312, and 314. A high voltage (Vg) in the approximate range of 1-2.5V, e.g., approximately 1.8V, is applied to control gate 310, while a high voltage (Vs) in the approximate range of 1-1.6V, e.g., approximately 1V, is applied to inversion diffusion region 322. Inversion diffusion region 316 can be tied to a low voltage (Vd) of approximately 0V. Inversion diffusion region 320 can be allowed to float.

Again, the voltages illustrated in FIG. 9 are by way of example only and it will be understood that the actual voltages used would depend on the requirements of the specific implementation.

Figure 10:
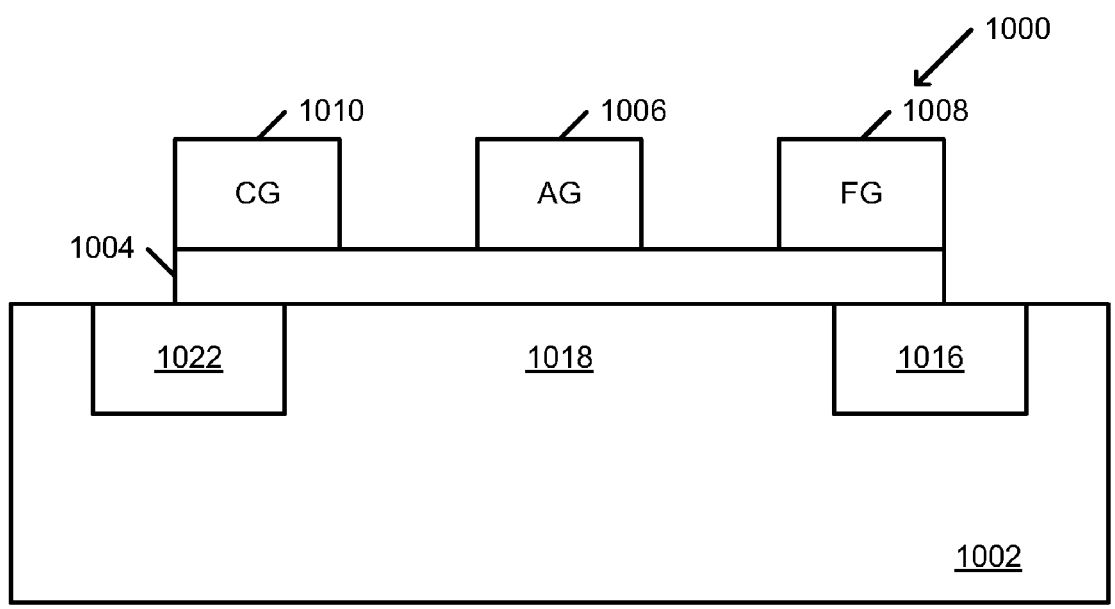
FIG. 10 is a diagram illustrating a non-volatile memory device configured in accordance with another embodiment.

FIG. 10 is a diagram illustrating an example non-volatile memory device 1000 configured in accordance with another embodiment. Like device 300, device 1000 is an NMOS device. Thus, device 1000 comprises a P-type substrate 1002. It will be understood, however, that in other embodiments device 1000 can be a PMOS device comprising a N-type substrate. Accordingly, the examples described herein should not be seen as limiting the methods and devices described herein to NMOS devices. P-type substrate 1002 can have a dielectric layer 1004 formed thereon. For example, dielectric layer 1004 can be a silicon dioxide, dielectric layer. Assist gate 1006 is then formed on the dielectric layer along with floating gate 1008 and a control gate 1010. Importantly, assist gate 1006 as well as floating gates 1008 and control gate 1010, can be formed using a single poly fabrication process.

By applying the proper voltages to assist gate 1006 an inversion diffusion region can be formed under dielectric layer 1004 in substrate 1002. In the example of FIG. 10, the inversion diffusion region is a N+ diffusion region. Unlike device 300, however, device 1000 also comprises diffusion regions 1016 and 1022 formed using conventional methods.

Figure 11:
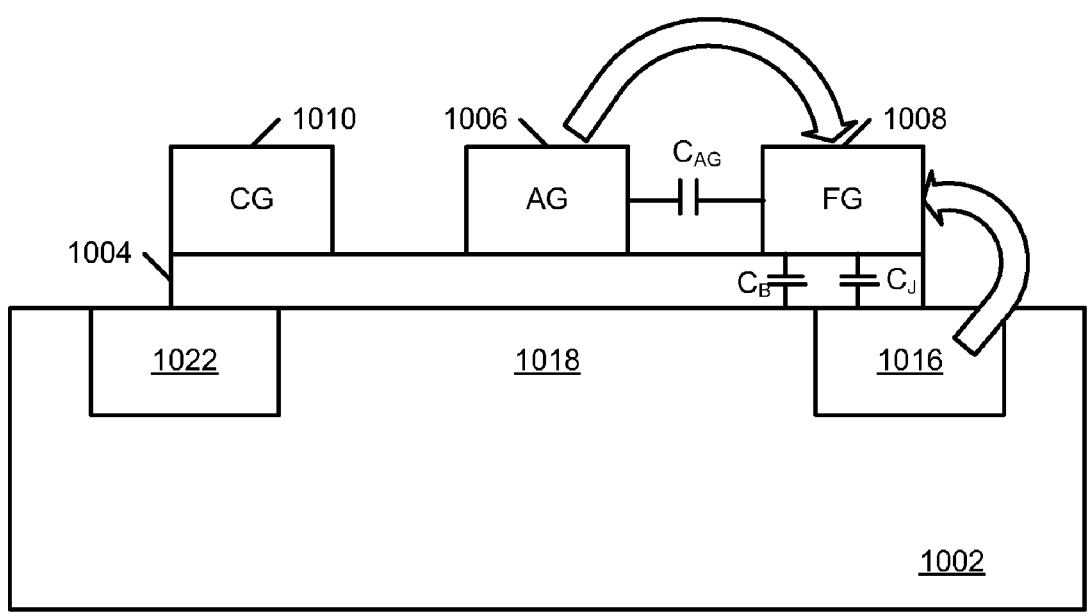
FIG. 11 is a diagram illustrating the coupling between an assist gate and a floating gate for the device of FIG. 10.

Assist gate 1006 can couple with floating gate 1008 in order to provide the field necessary to induce carriers in a channel region formed in substrate 1002 to penetrate dielectric layer 1004 into floating gate 1008. This coupling can be illustrated with the aid of FIGS. 11 and 12. FIG. 11 is a diagram illustrating the capacitance formed between the various gates and layers of device 1000. As can be seen, when a voltage is applied to assist gate 1006 the voltage can be coupled to floating gate 1008 via assist gate capacitances ($C_{AG}$). Floating gate 308 is then coupled with substrate 302 via bulk capacitance ($C_B$). In addition, floating gate 1008 can be coupled with diffusion region 1016 via junction capacitance ($C_J$), when a voltage is applied to diffusion region 1016. It is the capacitive coupling mechanisms that create the field necessary to cause carriers in substrate 1002 to penetrate dielectric layer 1004 into floating gate 1008.

Figure 12:
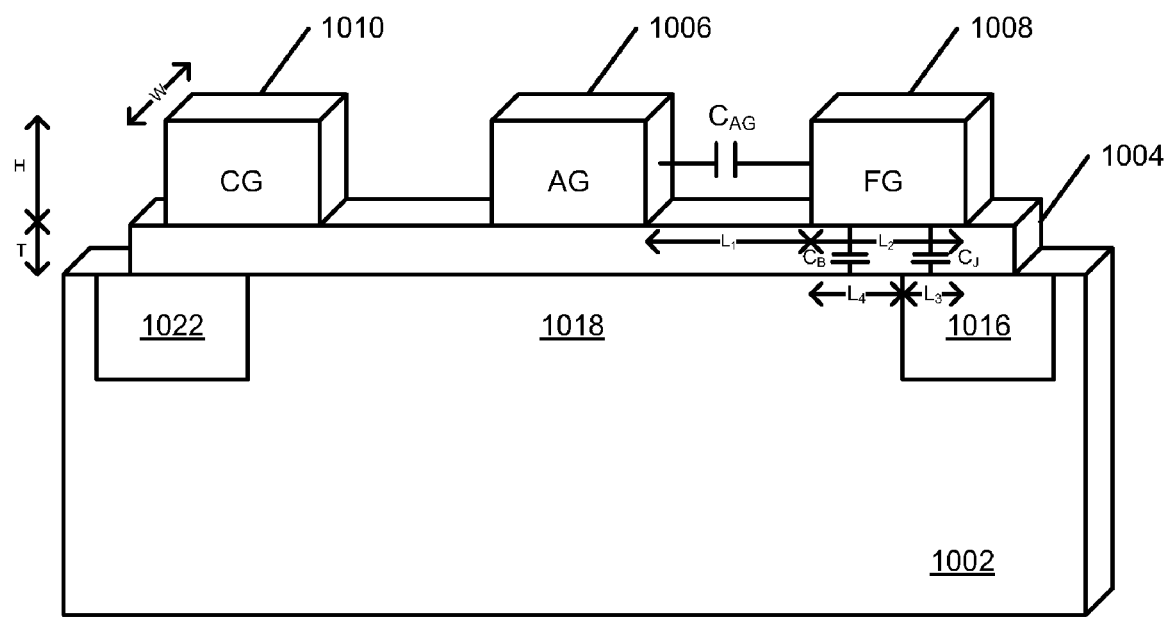
FIG. 12 is a diagram illustrating the dimensions associated with the gates and layers of the device in FIG. 10.

FIG. 12 is a diagram illustrating example dimensions associated with device 1000 in accordance with one particular implementation. These dimensions can be used to illustrate the coupling that can be produced for device 1000. First, the assist gate capacitance ($C_{AG}$), junction capacitance ($C_J$), and bulk capacitance ($C_B$) are given by the following equations:

$$C_{AG} = \in(H*W)/L1 \quad (6)$$

$$C_B = \in(L3*W)/T \quad (7)$$

$$CJ = \in(L4*W)/T \quad (8)$$

Where,
∈ = dielectric constant; and
W = the width of the gate into the page.
H = the height of the gate
L1 = the spacer length between the gates.
L3 = the length of the portion of the dielectric layer under floating gate, excluding L4
L4 = the length of the dielectric layer under the floating gate and above the diffusion region
T = the thickness of dielectric layer Thus, the assist gate capacitance ($C_{AG}$) is equal to ∈ multiplied by the height of assist gate 1006, multiplied by the width of assist gate 1006, and then divided by the spacing between assist gate 1006 and floating gate 1008. The bulk capacitance ($C_B$) is equal to ∈ multiplied by the length of dielectric layer 1004 under floating gate 1008, excluding the portion that overlaps with diffusion region 1016, multiplied by the width of floating gate 1008, and then divided by the height of dielectric layer 1004. The junction capacitance ($C_J$) is equal to ∈ multiplied by the length of dielectric layer 1004 under floating gate 1008 and over diffusion region 1016, multiplied by the width of floating gate 1008, then divided by the thickness of dielectric layer 1004.

The total capacitance is then given by the following equation:

$$C_{TOT} = C_J + C_{AG} + C_B \quad (9)$$

The coupling ratio between assist gate 1006 and floating gate 1008 is then given by the following equation;

$$\alpha_{AG} = C_{AG}/C_{TOT} \quad (10)$$

The coupling ratio between diffusion region 1016 and floating gate 1008 is then given by the following equation:

$$\alpha_J = C_J/C_{TOT} \quad (11)$$

Accordingly, the voltage on floating gate 1008 can be given by the following equation;

$$V_{FG} = (V_{AG}*\alpha_{AG}) + (V_N*\alpha_J) \quad (12)$$

Where,
$V_{AG}$ = the assist gate voltage, and
$V_N$ = the diffusion region voltage For example, in one embodiment a non-volatile memory device configured in accordance with the systems and methods described herein can comprise the following dimensions;
H = 1000 Å;
L1 = 200 Å;
L3 = 400 Å;
L4 = 200 Å; and
T = 100 Å.

Thus, the total capacitance is then given by equation (9):

$$C_{TOT} = C_J + C_{AG} + C_B = \in 11W$$

The coupling between assist gate 1006 and floating gate 1008 is then given by equation (10):

$$\alpha_{AG} = C_{AG}/C_{TOT} = \in 5W/\in 11W = 5/11$$

The coupling between diffusion region 1016 and floating gate 1008 is then given by equation (11):

$$\alpha_J = C_J/C_{TOT} = \in 2W/\in 11W = 2/11$$

The voltage on floating gate 308 can be given by equation (12):

$$V_{FG} = V_{AG} * \alpha_{AG} + V_N * \alpha_J$$
$$= 5/11 V_{AG} + 2/11 V_N$$

It will be understood that the dimensions described above can vary depending on the requirements of a specific invention; however, it will be clear that sufficient coupling must be achieved regardless of the dimensions used. Accordingly, the actual dimension for a given implementation must be sufficient to provide the required coupling.

In certain other embodiments, for example, the dimensions described above can have values in the following approximate ranges:

H=800-1500 Å;
L1=160-300 Å;
L3=300-500 Å;
L4=160-300 Å; and
T=50-250 Å.

Further, it will be understood that while the spacing between the gates was uniform in the examples described above, other embodiments can have non-uniform spacing.

Figure 13:
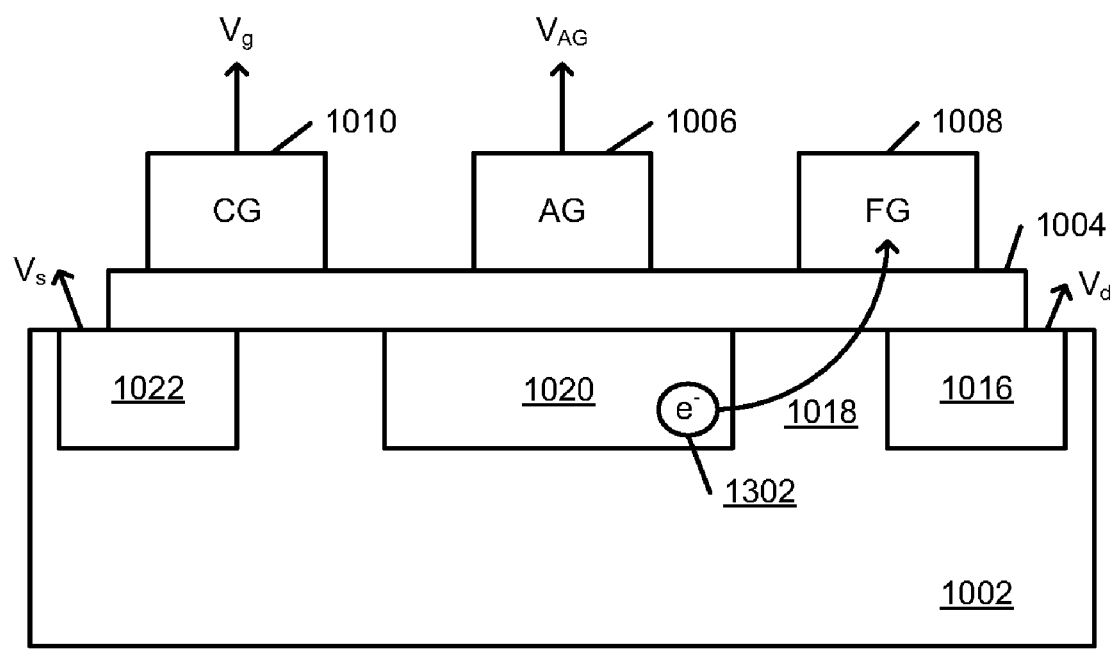
FIG. 13 is a diagram illustrating an example of program operation for the device of FIG. 10 in accordance with one embodiment.

An inversion diffusion region can be formed in device 1000 in order to produce the carriers necessary to program and erase floating gate 1008. This can be illustrated with the aid of FIGS. 13-16. FIG. 13 is a diagram illustrating an example program operation for device 1000 in accordance with one embodiment. By applying the proper voltages to assist gates 1006, N+ inversion diffusion region 1020 can be formed in substrate 1002. Voltages can then be applied to diffusion regions 1016 and 1022 in order to create a large lateral electric field between diffusion regions 1016 and 1020. The voltage coupled with floating gate 1008 can produce a channel in channel region 1018 and the large lateral electric field can induce carrier 1302, i.e., hot electrons, to flow in the channel from inversion diffusion region 1020 toward diffusion region 1016 and inject through dielectric layer 1004 into floating gate 1008. Accordingly, in the example of FIG. 13, CHE programming is used to vary the threshold of floating gate 1008.

It will be understood, that carrier 1302 must have sufficient energy to overcome the barrier height of dielectric layer 1004. For example, if dielectric layer 1004 is a silicon dioxide dielectric layer, then carrier 1302 must have energy exceeding 3.2 eV in order to overcome the barrier height of the silicon dioxide layer 1004.

Thus, high voltages must be applied to assist gate 1006 and diffusion region 1016 in order to couple voltage to floating gate 1008. A high voltage must also be applied to control gate 1010 in order to turn on the access transistor and allow current to flow in the storage side of device 1000. In the example of FIG. 13, a high voltage (Vg) of approximately 1V is applied to control gate 1010, while high voltage ($V_{AG}$) of approximately 8V is applied to assist gate 1006. Further, a high voltage (Vd) of approximately 5V is applied to diffusion region 1016, while diffusion region 1022 is tied to a low voltage (Vs) of approximately 0V.

It will be understood that the voltages illustrated are by way of example only and that the actual voltages will depend on the requirements of the specific implementation. For example, in certain embodiments, the voltage applied to control gate 1010 can be in the approximate range of 0.5-1.5 V, the voltage applied to assist gate 1006 can be in the approximate range of 6-9V, and the voltage applied to diffusion region 1016 can be in the approximate range of 4-6V.

Figure 14:
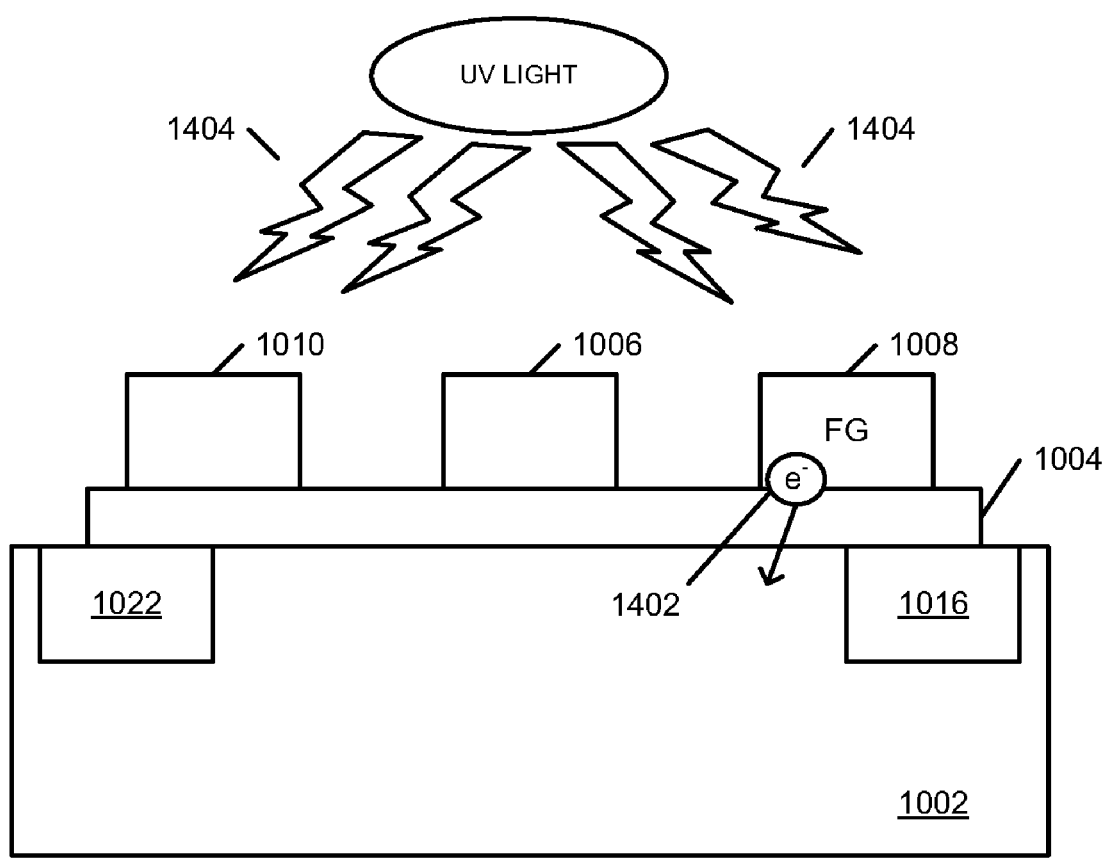
FIG. 14 is a diagram illustrating an example of an erase operation for the device of FIG. 10 in accordance with one embodiment.

FIG. 14 is a diagram illustrating an example erase operation for device 1000 in accordance with one embodiment. In the example of FIG. 14, ultraviolet (UV) radiation 1404 is incident on device 1000. The energy from radiation 1404 will provide electron 1402 with sufficient energy to penetrate dielectric layer 1004 and escape back into substrate 1002.

Figure 15:
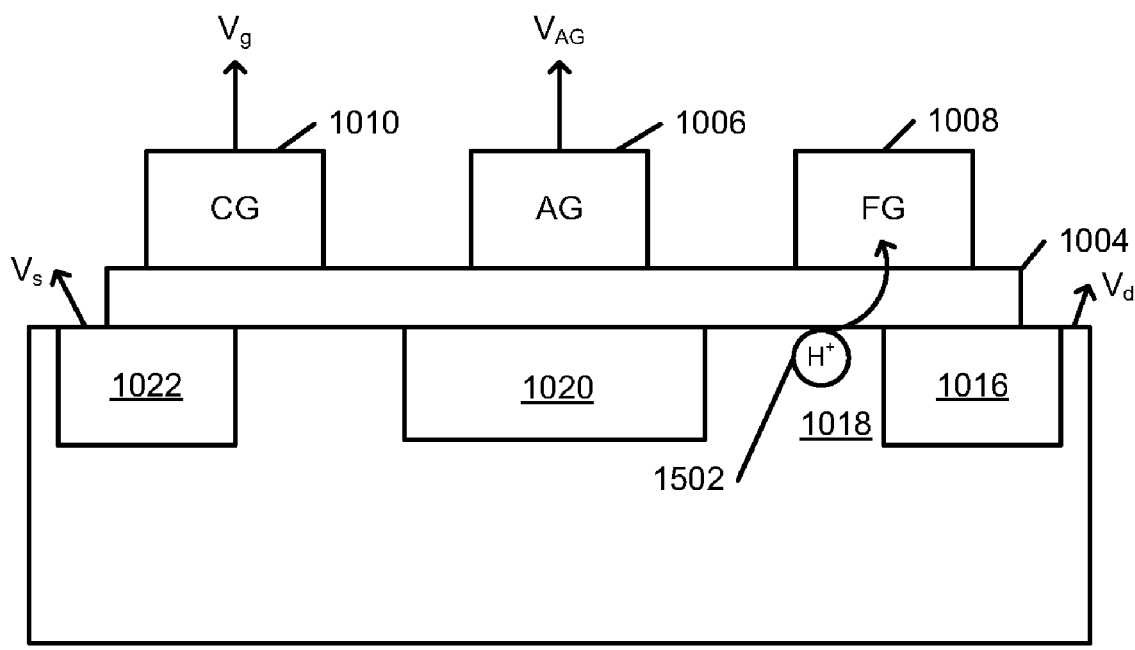
FIG. 15 is a diagram illustrating an example of an erase operation for the device of FIG. 10 in accordance with another embodiment.

In FIG. 15, avalanche hot carrier injection is used to erase device 1000 in accordance with another embodiment. Thus, in the example of FIG. 15, voltages are applied to diffusion regions 1022 and 1016 in order to create a large lateral electric field that will cause carriers 1502, in this case holes 1502, to inject into floating gate 1008.

In the example in FIG. 15, a high voltage (Vd) in the approximate range of 4-6V, e.g., approximately 5V, is applied to diffusion region 1016, while a low voltage (Vs) of approximately 0V is applied to diffusion region 1022. These voltages produce the high lateral electric field needed to induce holes 1502 into channel region 1018. A high voltage ($V_{AG}$) in the approximate range of 4-5V, e.g., approximately 3V, is applied to assist gate 1006 in order to create inversion diffusion regions 1020. A high voltage (Vg) in the approximate range of 3-5V, e.g., approximately 4V, is applied to control gate 1010.

It will be understood, however, that the voltages illustrated in FIG. 15 are by way of example only and that the actual voltages used will depend on the requirements of a specific implementation.

Figure 16:
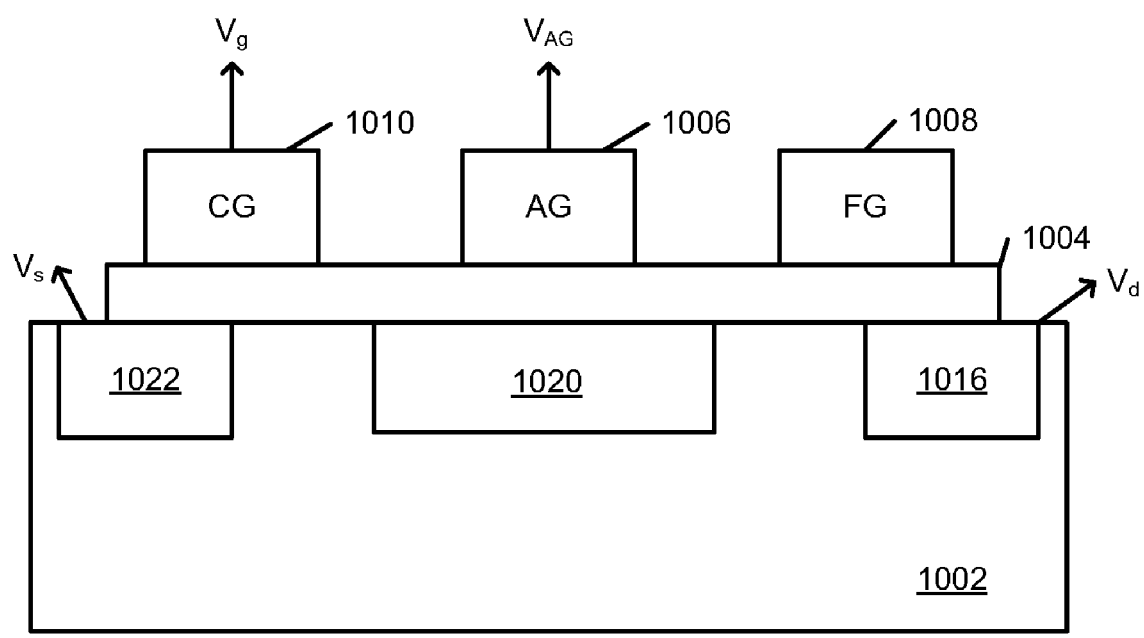
FIG. 16 is a diagram illustrating an example of read operation for the device of FIG. 10 in accordance with one embodiment.

FIG. 16 is a diagram illustrating an example read operation for device 1000 in accordance with one embodiment. First, high voltages must be applied to assist gate 1006 in order to create inversion diffusion region 1020. A high voltage can then be applied to control gate 1010 to turn on the access transistor portion of device 1000. A high voltage can also be applied to diffusion region 1022, while a low voltage is applied to diffusion region 1016.

In the example of FIG. 16, a high voltage ($V_{AG}$) in the approximate range of 6-9V, e.g., approximately 8V, is applied to assist gate 1006. A high voltage (Vg) in the approximate range of 1-2.5V, e.g., approximately 1.8V, is applied to control gate 1010, while a high voltage (Vs) in the approximate range of 1-1.6V, e.g., approximately 1V, is applied to diffusion region 1022. Diffusion region 1016 can be tied to a low voltage (Vd) of approximately 0V.

Again, the voltages illustrated in FIG. 16 are by way of example only and it will be understood that the actual voltages used would depend on the requirements of the specific implementation.

Accordingly, the non-volatile memory devices described above, and the methods associated therewith, can provide higher densities, lower cost, and decrease power consumption. Further, the devices described above are compatible with conventional single poly fabrication processes, which can further reduce costs and increase throughput.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A memory cell, comprising:
   a substrate;
   a dielectric layer formed on the substrate;
   a floating gate formed on the dielectric layer;

a control gate formed on the dielectric layer;
a first assist gate formed on the dielectric layer near the floating gate;
a second assist gate formed on the dielectric layer near the control gate; and
a third assist gate formed on the dielectric layer directly between the floating gate and the control gate,
wherein the floating gate, the control gate, and the first, second, and third assist gates are formed directly on the dielectric layer.

2. The memory cell of claim 1, wherein the first, second, and third assist gates are configured to form inversion diffusion regions in the substrate when a sufficient voltage is supplied to the first, second, and third assist gates.

3. The memory cell of claim 1, wherein the substrate is a p-type substrate.

4. The memory cell of claim 1, wherein the substrate is an n-type substrate.

5. The memory cell of claim 1, wherein the floating gate, control gate, and first, second, and third assist gates can be fabricated using a single poly processes.

6. The memory cell of claim 1, wherein the first and third assist gates are configured to couple voltages applied to the first and third assist gates with the floating gate.

7. The memory cell of claim 6, wherein the capacitance between the assist gates and the floating gate is $\in$ multiplied by the height of the assist gates, multiplied by the width of the assist gates, and then divided by the spacing between assist gates and floating gate.

8. The memory cell of claim 7, wherein the height of the assist gates is approximately 800~1500 Å.

9. The memory cell of claim 7, wherein the space between the assist gate and the floating gate is approximately 160~300 Å.

* * * * *